US012792073B2

(12) United States Patent
Lin

(10) Patent No.: US 12,792,073 B2
(45) Date of Patent: Nov. 10, 2026

(54) BANDGAP REFERENCE CIRCUIT

(71) Applicant: EMEMORY TECHNOLOGY INC., Hsinchu (TW)

(72) Inventor: Zhe-Yi Lin, Hsinchu County (TW)

(73) Assignee: EMEMORY TECHNOLOGY INC., Hsinchu (TW)

( * ) Notice: Subject to any disclaimer, the term of this patent is extended or adjusted under 35 U.S.C. 154(b) by 15 days.

(21) Appl. No.: 19/045,558

(22) Filed: Feb. 5, 2025

(65) Prior Publication Data

US 2025/0264896 A1 Aug. 21, 2025

Related U.S. Application Data

(60) Provisional application No. 63/554,164, filed on Feb. 16, 2024.

(51) Int. Cl.
*G05F 1/56* (2006.01)
*G11C 16/04* (2006.01)
(Continued)

(52) U.S. Cl.
CPC .............. *G05F 1/56* (2013.01); *G11C 16/045* (2013.01); *G11C 16/10* (2013.01); *G11C 16/14* (2013.01);
(Continued)

(58) Field of Classification Search
CPC ... G05F 1/56; G05F 3/30; G05F 1/567; G05F 3/20; G05F 3/26; G05F 3/267;
(Continued)

(56) References Cited

U.S. PATENT DOCUMENTS 7,170,336 B2 1/2007 Hsu
7,253,597 B2 8/2007 Brokaw
(Continued)

FOREIGN PATENT DOCUMENTS

CN 112015226 A 12/2020
CN 116069105 A * 5/2023 .............. G05F 1/56
(Continued)

OTHER PUBLICATIONS

Office action dated Oct. 3, 2025 from the Taiwan corresponding application.

*Primary Examiner* — Jung Kim
(74) *Attorney, Agent, or Firm* — WPAT, P.C.; Anthony King

(57) ABSTRACT

A bandgap reference circuit includes a first, a second and a third current source, a first and a second amplifier. The first, the second and the third current source each includes two cascode PMOS transistors for reducing the voltage stress applied to PMOS transistors when receives a high power supply voltage. The first amplifier controls the PMOS transistors in the first and the second current source to ensure that the PMOS transistors have enough headroom when receives a low power supply voltage. The second amplifier provides a gain-boosting loop to prevent the system mismatch of the PMOS transistors in the first, the second and the third current source. A temperature coefficient adjustment unit introduces positive temperature coefficients and negative temperature coefficients in the currents generated by the first and second current source, and a resistor generates the reference voltage according to a current duplicated by the third current source.

19 Claims, 5 Drawing Sheets

(51) Int. Cl.

| | |
|---|---|
| ***G11C 16/10*** | (2006.01) |
| ***G11C 16/14*** | (2006.01) |
| ***G11C 16/26*** | (2006.01) |
| ***H10B 41/35*** | (2023.01) |
| ***H10B 41/70*** | (2023.01) |

(52) U.S. Cl.
CPC ............. *G11C 16/26* (2013.01); *H10B 41/35* (2023.02); *H10B 41/70* (2023.02)

(58) Field of Classification Search
CPC . G05F 3/222; G05F 3/225; G05F 3/24; G05F 3/242; G05F 3/245; G11C 16/045; G11C 16/10; G11C 16/14; G11C 16/26; H10B 41/35; H10B 41/70; H10B 41/60
See application file for complete search history.

(56) References Cited

U.S. PATENT DOCUMENTS

| | | | |
|---|---|---|---|
| 7,482,798 B2 | 1/2009 | Han | |
| 2024/0118723 A1* | 4/2024 | Mohamed Hammam .................. | G05F 3/267 |

FOREIGN PATENT DOCUMENTS

| | | |
|---|---|---|
| CN | 117348676 A | 1/2024 |
| TW | 201612673 | 4/2016 |
| TW | 202349368 | 12/2023 |

* cited by examiner

BANDGAP REFERENCE CIRCUIT

CROSS REFERENCE

This application claims the benefit of prior-filed U.S. provisional application No. 63/554,164, filed on Feb. 16, 2024, which is incorporated by reference in its entirety.

TECHNICAL FIELD

The present disclosure relates to a bandgap reference circuit, and more particularly, to a bandgap reference circuit capable of operating in a wide voltage range.

DISCUSSION OF THE BACKGROUND

A bandgap reference circuit is a type of voltage reference circuit that provides a stable and accurate reference voltage for use in various electronic systems. It is designed to produce a constant output voltage that is relatively immune to changes in temperature, power supply voltage, and other environmental factors.

One of the main challenges faced by bandgap reference circuits is achieving high accuracy and stability over a wide range of operating conditions. For example, the bandgap reference circuit may need to be able to operate at supply voltages ranging from 1.5V to 0.9V so as to meet the requirements for various applications. However, to allow the bandgap reference circuit to operate at higher voltages (such as 1.5V), additional protection measures may be needed to ensure that the core devices of the bandgap reference circuit remain within the safe operating area (SOA). However, these protection measures may lead to the bandgap reference circuit not functioning properly at low voltages (such as 0.9V). Therefore, designing a bandgap reference circuit that can support different voltage ranges and output a stable reference voltage has become an issue to be solved.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a bandgap reference circuit. The bandgap reference circuit includes a first current source, a second current source, a third current source, a first amplifier, a second amplifier, a resistor, and a temperature coefficient adjustment unit. The first current source outputs a first current through a first node, and includes a first P-channel metal-oxide-semiconductor (PMOS) transistor and a second PMOS transistor connected in a cascode form between a power supply voltage terminal and the first node. The second current source outputs a second current through a second node, and includes a third PMOS transistor and a fourth PMOS transistor connected in the cascode form between the power supply voltage terminal and the second node. The current source outputs a third current through an output node, and includes a fifth PMOS transistor and a sixth PMOS transistor connected in the cascode form between the power supply voltage terminal and the output node. The first amplifier has a first input terminal coupled to the first node, a second input terminal coupled to the second node, and an output terminal coupled to a control terminal of the first PMOS transistor and a control terminal of the third PMOS transistor. The second amplifier has a first input terminal coupled to a third node connecting the fifth PMOS transistor and the sixth PMOS transistor, a second input terminal coupled to a fourth node connecting the first PMOS transistor and the second PMOS transistor, and an output terminal coupled to a control terminal of the sixth PMOS transistor. The resistor receives the third current and generates the reference voltage. The temperature coefficient adjustment unit includes a first bipolar junction transistor (BJT) configured to receive the first current and a second BJT configured to receive the second current.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
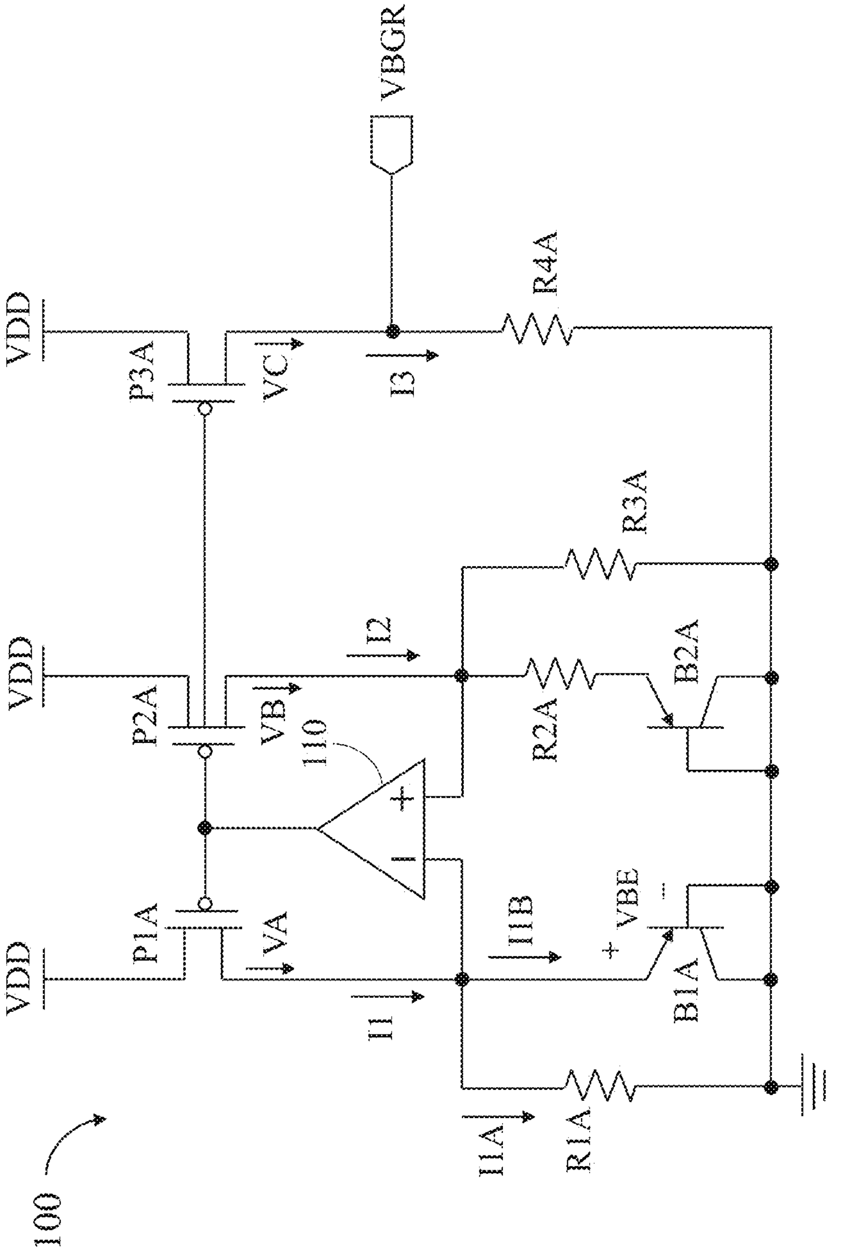
FIG. 1 shows a bandgap reference circuit according to one comparative embodiment of the present disclosure.

FIG. 1 shows a bandgap reference circuit 100 according to one comparative embodiment of the present disclosure. The bandgap reference circuit 100 includes P channel metal-oxide-semiconductor (PMOS) transistors P1A, P2A, and P3A, an amplifier 110, resistors R1A, R2A, R3A, and R4A, and bipolar junction transistors (BJTs) B1A and B2A.

The PMOS transistor P1A includes a first terminal coupled to an power supply voltage terminal for receiving the power supply voltage VDD, a second terminal, and a control terminal. The PMOS transistor P2A includes a first terminal coupled to the power supply voltage terminal for receiving the power supply voltage VDD, a second terminal, and a control terminal coupled to the control terminal of the PMOS transistor P1A. The PMOS transistor P3A includes a first terminal coupled to the power supply voltage terminal for receiving the power supply voltage VDD, a second terminal, and a control terminal coupled to the control terminal of the PMOS transistor P1A.

The amplifier 110 has a first input terminal coupled to the second terminal of the PMOS transistor P1A, a second input terminal coupled to the second terminal of the PMOS transistor P2A, and an output terminal coupled to the control terminal of the PMOS transistor P1A and the control terminal of the PMOS transistor P2A.

The BJT B1A has an emitter coupled to the second terminal of the PMOS transistor P1A, a collector coupled to a ground terminal, and a base coupled t to the collector of the BJT B1A. The BJT B2A has an emitter, a collector coupled to the ground terminal, and a base coupled to the collector of the BJT B2A.

The resistor R1A has a first terminal coupled to the second terminal of the PMOS transistor P1A, and a second terminal coupled to the ground terminal. The resistor R2A has a first terminal coupled to the second terminal of the PMOS transistor P2A, and a second terminal coupled to the emitter of the BJT B2A. The resistor R3A has a first terminal coupled to the second terminal of the PMOS transistor P2A, and a second terminal coupled to the ground terminal. The resistor R4A has a first terminal coupled to the second terminal of the PMOS transistor P3A, and a second terminal coupled to the ground terminal.

The bandgap reference circuit 100 can output the reference voltage VBGR through the second terminal of the PMOS transistor P3A, and the reference voltage VBGR can be represented as I3·R4A, where I3 is the current conducted by the PMOS P3A and flow through the resistor R4A.

Furthermore, since the PMOS transistors P1A, P2A, and P3A are connected as a current mirror, the current I3 conducted by the transistor P3A should be equal to the current I1 conducted by the transistor P1A and the current I2 conducted by the transistor P2A (when the PMOS transistors P1A, P2A, and P3A have the same width to length ratio). In addition, the current I1 is equal to the sum of the current I1A that flows through the resistor R1A and the current I1B that flows through the BJT B1A. The current I1A is proportional to the base-emitter voltage VBE of the BJT B1A, which has a negative temperature coefficient, and the current I1B is proportional to the absolute temperature and thus has a positive temperature coefficient. Therefore, by properly selecting the resistor R1A, the current I1 can be substantially immune to the changes in temperature, and so as the reference voltage VBGR provided by the bandgap reference circuit 100.

However, when the temperature increases, the voltage VC at the second terminal of the PMOS transistor P3A may become different from the voltage VA at the second terminal of the PMOS transistor P1A and the voltage VB at the second terminal of the PMOS transistor P2A. In other words, the system mismatch among the PMOS transistors P1A, P2A, and P3A may occur as the temperature increases. Such issue may become worse when the bandgap reference circuit 100 operates with a low power supply voltage. For example, in some cases, the bandgap reference circuit 100 can be used to provide a reference voltage VBGR lower than 1V, and the power supply voltage VDD may be in a range from 0.9V to 1.5V. In such case, when the power supply voltage VDD is about 0.9V, the system mismatch may become obvious and unacceptable.

Furthermore, when the bandgap reference circuit 100 operates with a high power supply voltage (e.g., 1.5V), the PMOS transistors P1A, P2A, and P3A may need to endure higher voltage stress. Therefore, the advance process utilizing thin gate oxide may not be suitable to form the PMOS transistors P1A, P2A, and P3A, which hinders the use of the advance process.

Figure 2:
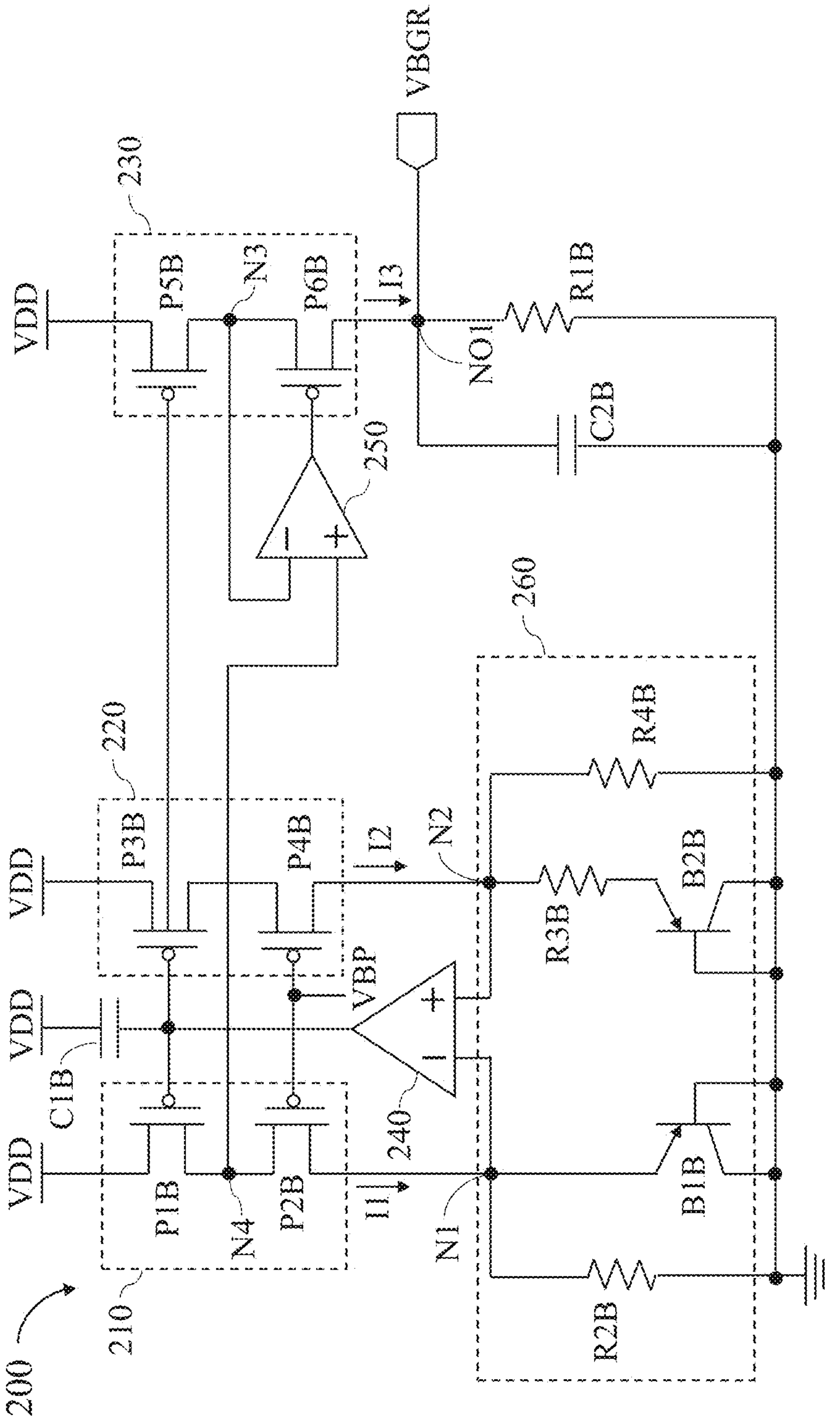
FIG. 2 shows a bandgap reference circuit according to one embodiment of the present disclosure.

FIG. 2 shows a bandgap reference circuit 200 according to one embodiment of the present disclosure. The bandgap reference circuit 200 includes current sources 210, 220, 230, amplifiers 240, 250, a temperature coefficient adjustment unit 260, and a resistor R1B.

The current source 210 outputs a current I1 through a node N1. The current source 210 includes PMOS transistors P1B and P2B that are connected in a cascode form between the power supply voltage terminal and the node N1. The current source 220 outputs a current I2 through a node N2. The current source 220 includes PMOS transistors P3B and P4B that are connected in a cascode form between the power supply voltage terminal and the node N2. The current source 230 outputs a current I3 through a node NO1 (i.e. an output node of the bandgap reference circuit 200). The current source 230 includes PMOS transistors P5B and P6B that are connected in a cascode form between the power supply voltage terminal and the node NO1. In some embodiments, the cascode structures of the current sources 210, 220, and 230 can help to reduce the voltage stress applied to each PMOS transistor when the power supply voltage VDD is rather high, thereby enabling the utilization of the advance node of thin gate oxide devices and ensuring that the PMOS transistors P1B, P2B, P3B, P4B, P5B, and P6B can operate in SOAs.

As shown in FIG. 2, the PMOS transistor P1B has a first terminal coupled to the power supply voltage terminal for receiving the power supply voltage VDD, a second terminal, and a control terminal. The PMOS transistor P2B has a first terminal coupled to the second terminal of the PMOS transistor P1B, a second terminal coupled to the node N1, and a control terminal. The PMOS transistor P3B has a first terminal coupled to the power supply voltage terminal for receiving the power supply voltage VDD, a second terminal, and a control terminal. The PMOS transistor P4B has a first terminal coupled to the second terminal of the PMOS transistor P3B, a second terminal coupled to the node N2, and a control terminal. The PMOS transistor P5B has a first terminal coupled to the power supply voltage terminal for receiving the power supply voltage VDD, a second terminal, and a control terminal. The PMOS transistor P6B has a first terminal coupled to the second terminal of the PMOS transistor P5B, a second terminal coupled to the node NO1, and a control terminal.

The amplifier 240 has a first input terminal coupled to the node N1, a second input terminal coupled to the node N2, and an output terminal coupled to the control terminal of the PMOS transistor P1B and the control terminal of the third PMOS transistor P3B. In some embodiments, the first input terminal of the amplifier 240 is a negative input terminal, and the second input terminal of the amplifier 240 is a positive input terminal. However, the present disclosure is not limited thereto. The output of the amplifier 240 controls the current sources 210 and 220 such that the voltages at nodes N1 and N2 are equal.

In the present embodiment, the bandgap reference circuit 200 may further include a capacitor C1B having a first terminal coupled to the power supply voltage terminal, and a second terminal coupled to the output terminal of the amplifier 240. The capacitor C1B can help to stabilize the output of the amplifier 240. However, the present disclosure is not limited thereto. In some embodiments, the capacitor C1B may be omitted.

The amplifier 250 has a first input terminal coupled to a node N3 connecting the PMOS transistor P5B and the PMOS transistor P6B, a second input terminal coupled to a node N4 connecting the PMOS transistor P1B and the PMOS transistor P2B, and an output terminal coupled to the control terminal of the PMOS transistor P6B. In some embodiments, the first input terminal of the amplifier 250 is a negative input terminal, and the second input terminal of the amplifier 250 is a positive input terminal. However, the present disclosure is not limited thereto. In some embodiments, the second input terminal of the amplifier 250 can be coupled to another node connecting the PMOS transistor P3B and the PMOS transistor P4B.

In the present embodiment, the amplifier 250 functions as a source follower and keeps the voltage at the node N3 (which connects to the second terminal of the PMOS transistor P5B and the first terminal of the PMOS transistor P6B) equals to the voltage at the node N4 (which connects to the second terminal of the PMOS transistor P1B and the first terminal of the PMOS transistor P2B). As a result, the drain-Source voltage of the PMOS transistors P1B, P3B, and P5B are the same, and the PMOS transistors P1B, P3B, and P5B can operate under the same condition regardless the change of temperature, and thus, the system mismatch can be significantly reduced. Furthermore, the gain boosting function provided the amplifier 250 can also help to increase the output resistance, thereby improving the performance of the of the bandgap reference circuit 200.

The temperature coefficient adjustment unit 260 includes BJTs B1B and B2B. The BJT B1B receives the at least part of the current I1 generated by the current source 210, and the BJT B2B receives at least part of the current I2 generated by the current source 220. The BJT B1B has an emitter coupled to the node N1 for receiving at least part of the current I1, a collector coupled to the ground terminal, and a base coupled to the ground terminal. In the present embodiment, the temperature coefficient adjustment unit 260 further includes a resistor R2B. The resistor R2B has a first terminal coupled to the first node N1, and a second terminal coupled to the ground terminal.

The BJT B2B has an emitter for receiving at least part of the current I2, a collector coupled to the ground terminal, and a base coupled to the ground terminal. In addition, the temperature coefficient adjustment unit 260 further includes resistors R3B and R4B. The resistor R3B has a first terminal coupled to the node N2, and a second terminal coupled to the emitter of the BJT B2B. The resistor R4B has a first terminal coupled to the node N2, and a second terminal coupled to the ground terminal.

By properly selecting the resistors R2B, R3B, and R4B, the temperature coefficient adjustment unit 260 can adjust the temperature coefficient of the currents I1 and I2 so as to mitigate the affection of temperature variation. Since the current source 210, 220, and 230 are connected as a current mirror, the currents I1 and I2 can be mirrored to generate the current I3, and the resistor R1B can receive the current I3 for generating the reference voltage VBGR. In the present embodiment, the resistor R1B has first terminal coupled to the node NO1, and a second terminal coupled to the ground terminal. In such case, the reference voltage VBGR can be outputted through the node NO1.

Furthermore, in the present embodiment, the bandgap reference circuit 200 may further include a capacitor C2B. The capacitor C2B has a first terminal coupled to the node NO1, and a second terminal coupled to the ground terminal. The capacitor C2B can be used for stabilizing the output of the reference voltage VBGR. However, the present disclosure is not limited thereto. In some embodiments, the capacitor C2B may be omitted.

In the present embodiment, the temperature coefficient adjustment unit 260 includes the resistors R2B, R3B, and R4B for adjusting the temperature coefficient. However, the present disclosure is not limited thereto. In some embodiments, some of the resistors may be omitted or some other resistors may be added.

Figure 3:
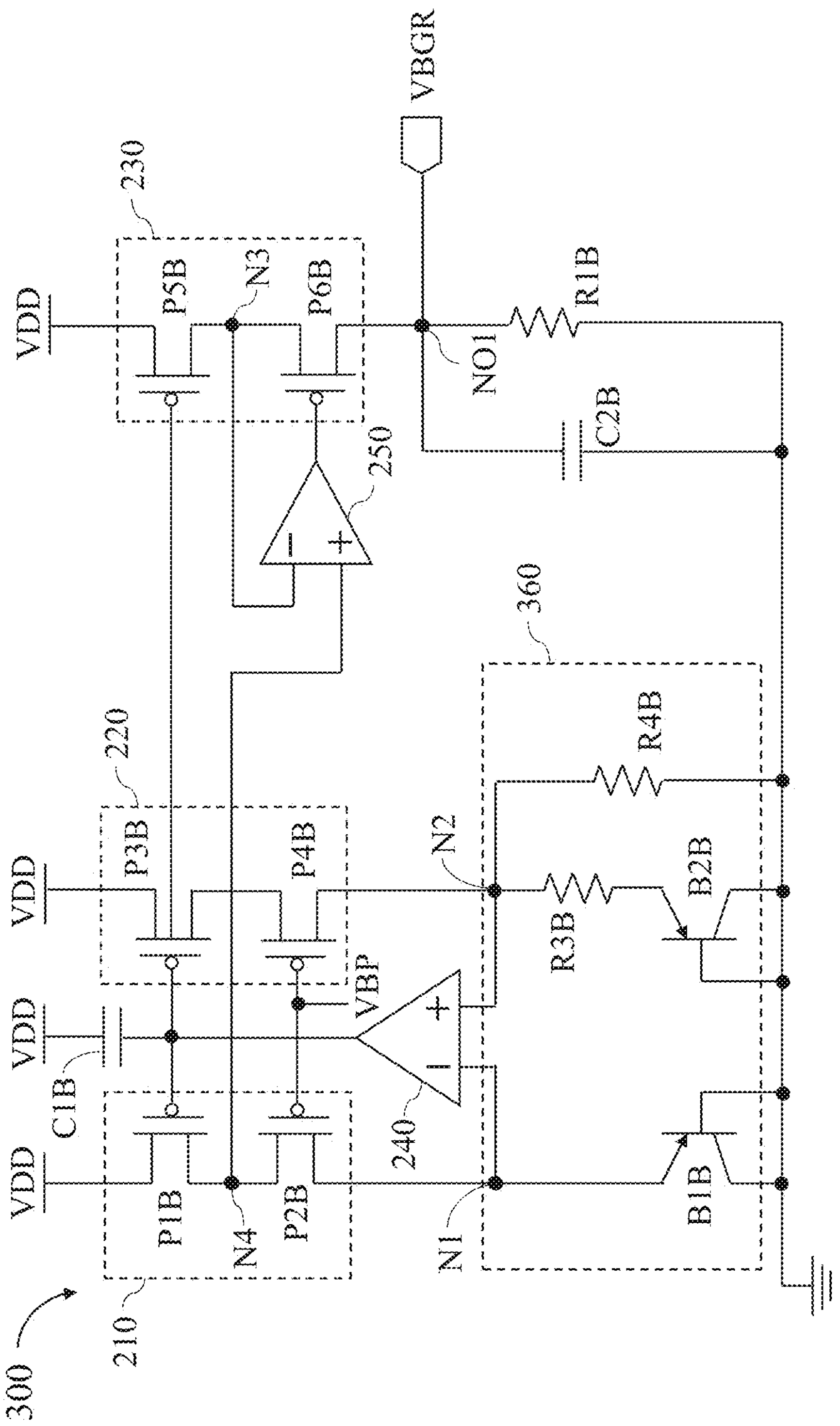
FIG. 3 shows a bandgap reference circuit according to another embodiment of the present disclosure.

FIG. 3 shows a bandgap reference circuit 300 according to one embodiment of the present disclosure. The bandgap reference circuit 300 is different from the bandgap reference circuit 200 in that the temperature coefficient adjustment unit 360 of the bandgap reference circuit 300 omits the resistor R2B.

Figure 4:
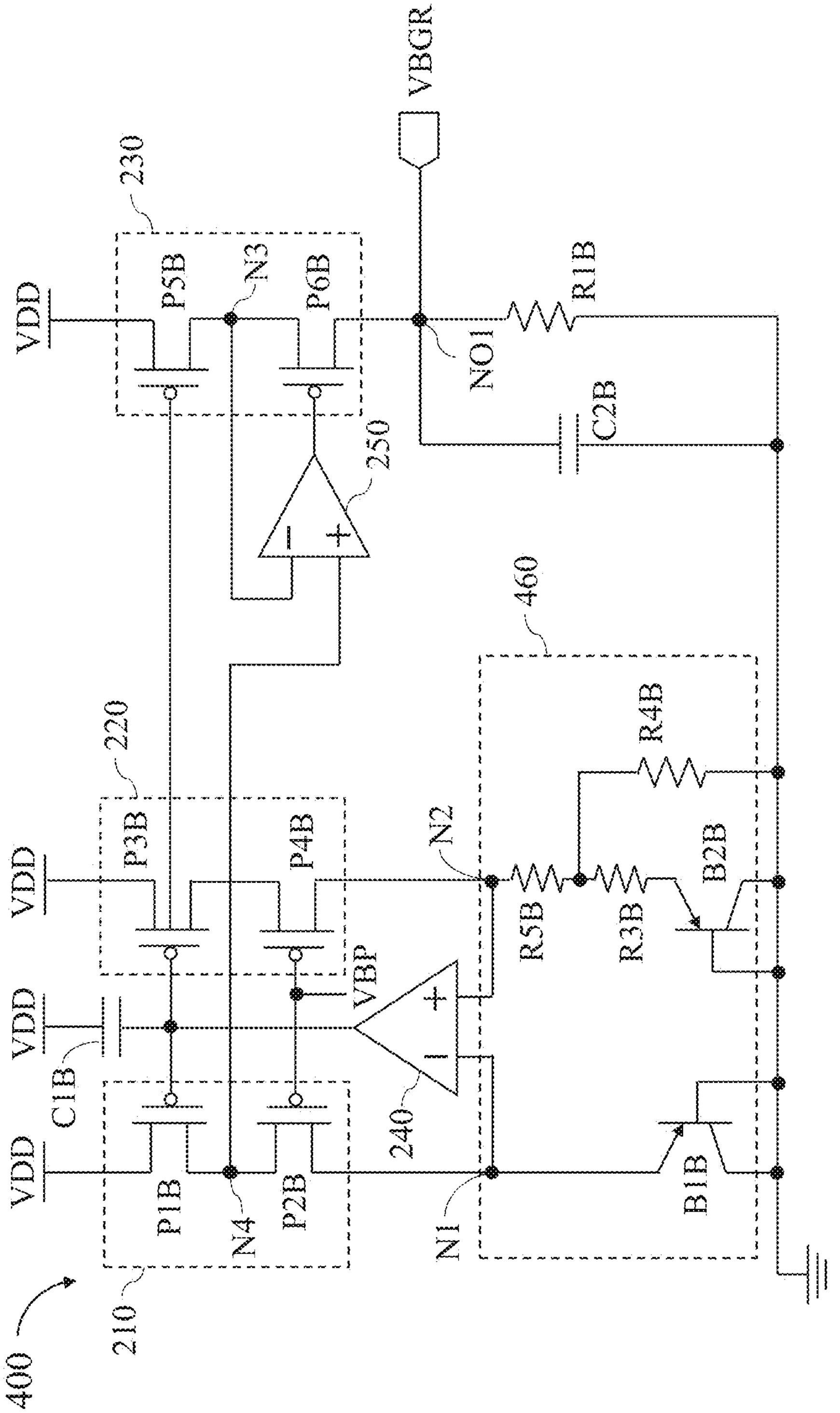
FIG. 4 shows a bandgap reference circuit according to another embodiment of the present disclosure.

FIG. 4 shows a bandgap reference circuit 400 according to one embodiment of the present disclosure. The bandgap reference circuit 400 is different from the bandgap reference circuit 300 in that the temperature coefficient adjustment unit 460 of the bandgap reference circuit 400 further includes a resistor R5B. The resistor R5B has a first terminal coupled to the second terminal of the PMOS transistor P4B and a second input terminal of the amplifier 250, and a second terminal coupled to the first terminal of the resistor R3B and the first terminal of the resistor R4B.

In the bandgap reference circuits 200, 300, and 400, when receiving the high power supply voltage VDD (e.g., 1.5V), the cascode structure of the current sources 210, 220, and 230 can distribute the high voltage borne by the PMOS transistors therein, thereby allowing the PMOS transistors P1B, P2B, P3B, P4B, P5B, and P6B to operate within their SOAs. However, when receiving the low power supply voltage VDD (e.g., 0.9V), the PMOS transistors P2B and P4B would need to be properly biased so that the PMOS transistors P1B and P3B can have enough of voltage headroom for normal operation.

In some embodiments, the control terminal of the PMOS transistor P2B and the control terminal of the PMOS transistor P4B can receive the same bias voltage VBP. In some embodiments, the bias voltage VBP can be substantially equal to VDD−2Vt, where VDD is the power supply voltage and Vt is the threshold voltage of the PMOS transistor P1B. In such case, the PMOS transistors P1B, P2B, P3B, and P4B can operate in the saturation mode when the power supply voltage VDD is rather high (e.g., greater than a threshold which can be 1.2V or at 1.5V). Also, when the power supply voltage VDD is rather low (e.g., smaller than the threshold or at 0.9V), the PMOS transistors P2B and P4B can be fully turned on and operate in the linear mode, thereby facilitating the operation of the PMOS transistors P1B and P3B.

In some embodiments, the bandgap reference circuits 200, 300, and 400 may further include a voltage generator for particularly providing the bias voltage VBP for the PMOS transistors P2B and P4B. However, the present disclosure is not limited thereto. In some embodiments, the bias voltage VBP for controlling the PMOS transistors P2B and P4B may be same as the bias voltage adopted by the amplifier 240. That is, the bias voltage VBP used by the amplifier 240 can be reused to control the PMOS transistors P2B and P4B.

Figure 5:
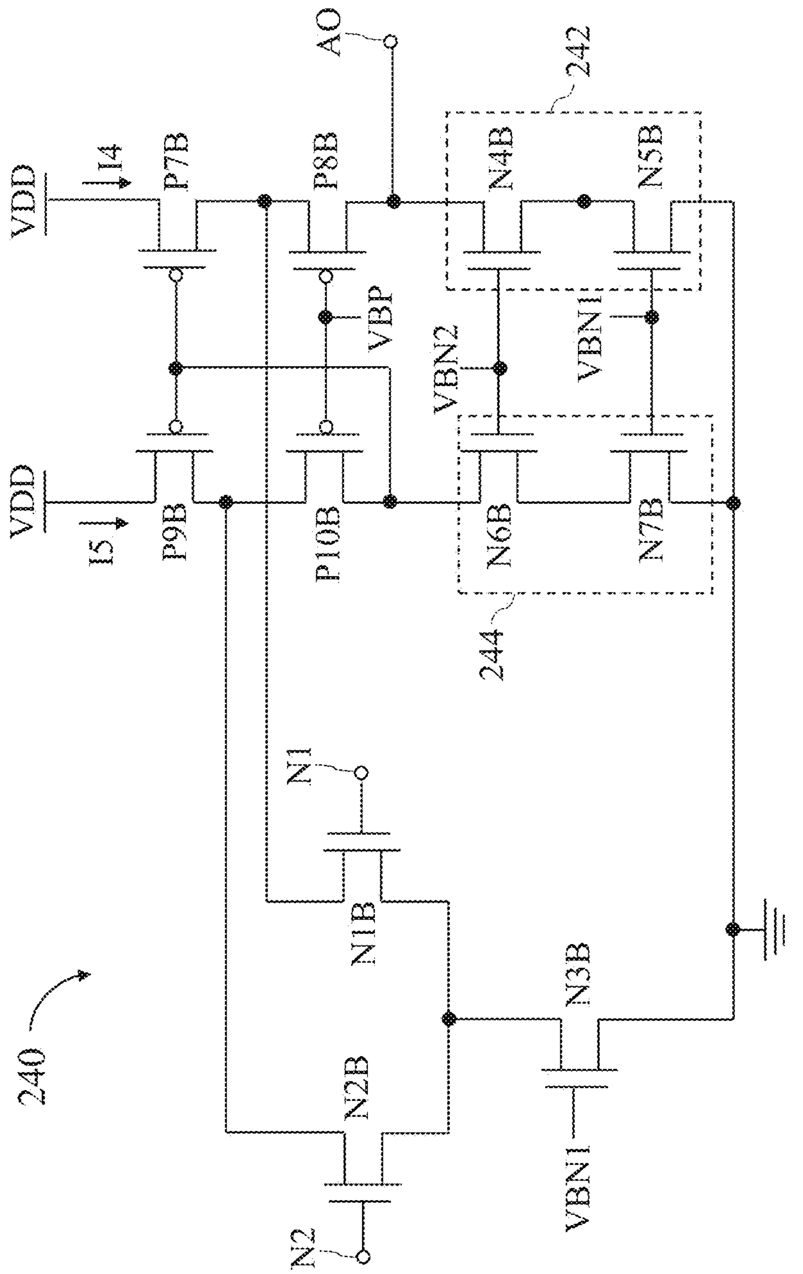
FIG. 5 shows an amplifier according to one embodiment of the present disclosure.

FIG. 5 shows the amplifier 240 according to one embodiment of the present disclosure. In the present embodiment, the amplifier 240 is a folded cascode amplifier that includes NMOS transistors N1B, N2B, N3B, PMOS transistors P7B, P8B, P9B, and P10B, and load units 242 and 244.

The NMOS transistor N1B has a first terminal, a second terminal, and a control terminal coupled to the first input terminal of the amplifier 240, which is coupled to the node N1 of the bandgap reference circuit 200, 300, or 400. The second NMOS transistor N2B has a first terminal, a second terminal, and a control terminal coupled to the second input terminal of the amplifier 240, which is coupled to the node N2 of the bandgap reference circuit 200, 300, or 400. The NMOS transistor N3B has a first terminal coupled to the second terminal of the NMOS transistor N1B and the second terminal of the NMOS transistor N2B, a second terminal coupled to the ground terminal, and a control terminal for receiving a bias voltage VBN1.

The PMOS transistor P7B has a first terminal coupled to the power supply voltage terminal, a second terminal coupled to the first terminal of the NMOS transistor N1B, and a control terminal. The PMOS transistor P8B has a first terminal coupled to the second terminal of the PMOS transistor P7B, a second terminal coupled to the output terminal of the amplifier 240, and a control terminal for receiving the bias voltage VBP.

The PMOS transistor P9B has a first terminal coupled to the power supply voltage terminal, a second terminal coupled to the first terminal of the NMOS transistor N2B, and a control terminal coupled to the control terminal of the PMOS transistor P7B. The PMOS transistor P10B has a first terminal coupled to the second terminal of the PMOS transistor P9B, a second terminal coupled to the control terminal of the PMOS transistor P9B, and a control terminal coupled to the control terminal of the PMOS transistor P8B.

The load unit 242 is coupled to the second terminal of the PMOS transistor P8B, and the load unit 244 is coupled to the second terminal of the PMOS transistor P10B. In the present embodiments, the load unit 242 includes NMOS transistors N4B and N5B, and the load unit 244 includes NMOS transistors N6B and N7B.

The NMOS transistor N4B has a first terminal coupled to the second terminal of the PMOS transistor P8B, a second terminal, and a control terminal for receiving a bias voltage VBN2. The NMOS transistor N5B has a first terminal coupled to the second terminal of the NMOS transistor N4B, a second terminal coupled to the ground terminal, and a control terminal for receiving the bias voltage VBN1.

The NMOS transistor N6B has a first terminal coupled to the second terminal of the PMOS transistor P10B, a second terminal, and a control terminal for receiving the bias voltage VBN2. The NMOS transistor N7B has a first terminal coupled to the second terminal of the NMOS transistor N6B, a second terminal coupled to the ground terminal, and a control terminal for receiving the bias voltage VBN1.

In the present embodiment, since the PMOS transistors P7B, P8B, P9B, and P10B are connected in a same manner as the PMOS transistors P1B, P2B, P3B, and P4B, the bias voltage VBP received by the PMOS transistors P8B and P10B are also provided to the control terminals of the PMOS transistors P2B and P4B. That is, the control terminal of the PMOS transistor P2B and the control terminal of the PMOS transistor P4B can be coupled to the control terminal of the PMOS transistor P8B. In some embodiments, to further ensure the bias voltage VBP can fit for both the amplifier 240 and the current sources 210 and 220, the PMOS transistors P7B, P8B, P9B, and P10 may have the same size factors as the PMOS transistors P1B, P2B, P3B, and P4B, making the current I4 flowing through the PMOS transistors P7B and P8B is equal to the current I1 and I2 (i.e., I1=I2=I4), and making the current I5 flowing through the PMOS transistors P9B and P10B is equal to the current I1 and I2 (i.e., I1=I2=I5). Specifically, the PMOS transistors P1B, P3B, P5B, P7B and P9B can all have the same size factor. In addition, the PMOS transistor P2B, P4B, P6B, P8B, and P10B can all have the same size factors.

Furthermore, in some embodiments, the PMOS transistors P1B, P3B, P5B, P7B and P9B may have different size factors from the PMOS transistor P2B, P4B, P6B, P8B, and P10B. For example, the width to length ratio of the PMOS transistor P2B can be greater than the width to length ratio of the PMOS transistor P1B. However, the present disclosure is not limited thereto.

By letting the PMOS transistors P7B, P8B, P9B, and P10B have the same size factors and same connecting relations as the PMOS transistors P1B, P2B, P3B, and P4B, the bias voltage VBP can ensure the PMOS transistors P2B and P4B to operate in the linear mode when the power supply voltage VDD is rather low (e.g., lower than a threshold). Therefore, the drain to source voltages of the PMOS transistors P2B and P4B can be reduced, and the PMOS transistors P2B and P4B can be seen as pass gates, thereby leaving more voltage headroom for the PMOS transistors P1B and P3B. As a result, the bandgap reference circuits 200, 300, and 400 are able to provide stable reference voltage VBGR whether to receive low power supply voltage or high power supply voltage.

In summary, the bandgap reference circuit provided by the embodiments of the present disclosure adopt the cascode structures in the current sources for alleviate the voltage stress applied on the transistors therein when receiving high power supply voltages. In addition, the bandgap reference circuits further include amplifiers that function as source followers so as to avoid the system mismatch of the transistors in the current sources. As a result, the bandgap reference circuits of the present disclosure are able to generate stable and accurate reference voltages for a wide power supply voltage range.

What is claimed is:

1. A bandgap reference circuit configured to generate and output a reference voltage through an output node and comprising:

a first current source configured to generate a first current through a first node, the first current source comprising a first P-channel metal-oxide-semiconductor (PMOS) transistor and a second PMOS transistor connected in a cascode form between a power supply voltage terminal and the first node;

a second current source configured to generate a second current through a second node, the second current source comprising a third PMOS transistor and a fourth PMOS transistor connected in the cascode form between the power supply voltage terminal and the second node;

a third current source configured to generate a third current through the output node, the third current source comprising a fifth PMOS transistor and a sixth PMOS transistor connected in the cascode form between the power supply voltage terminal and the output node;

a first amplifier having a first input terminal coupled to the first node, a second input terminal coupled to the second node, and an output terminal coupled to a control terminal of the first PMOS transistor and a control terminal of the third PMOS transistor, wherein the first input terminal of the first amplifier is a negative input terminal, and the second input terminal of the first amplifier is a positive input terminal;

a second amplifier having a first input terminal coupled to a third node connecting the fifth PMOS transistor and the sixth PMOS transistor, a second input terminal coupled to a fourth node connecting the first PMOS transistor and the second PMOS transistor, and an output terminal coupled to a control terminal of the sixth PMOS transistor;

a first resistor coupled to the output node and configured to receive the third current; and a temperature coefficient adjustment unit comprising a first bipolar junction transistor (BJT) configured to receive the first current and a second BJT configured to receive the second current.

2. The bandgap reference circuit of claim 1, wherein a control terminal of the second PMOS transistor and a control terminal of the fourth PMOS transistor are configured to receive a first bias voltage.

3. The bandgap reference circuit of claim 2, wherein the first bias voltage is equal to a power supply voltage received from the power supply voltage terminal minus two times a threshold voltage of the first PMOS transistor.

4. A bandgap reference circuit configured to generate and output a reference voltage through an output node and comprising:

a first current source configured to generate a first current through a first node, the first current source comprising a first P-channel metal-oxide-semiconductor (PMOS) transistor and a second PMOS transistor connected in a cascode form between a power supply voltage terminal and the first node;

a second current source configured to generate a second current through a second node, the second current source comprising a third PMOS transistor and a fourth PMOS transistor connected in the cascode form between the power supply voltage terminal and the second node;

a third current source configured to generate a third current through the output node, the third current source comprising a fifth PMOS transistor and a sixth PMOS transistor connected in the cascode form between the power supply voltage terminal and the output node;

a first amplifier having a first input terminal coupled to the first node, a second input terminal coupled to the second node, and an output terminal coupled to a control terminal of the first PMOS transistor and a control terminal of the third PMOS transistor;

a second amplifier having a first input terminal coupled to a third node connecting the fifth PMOS transistor and the sixth PMOS transistor, a second input terminal coupled to a fourth node connecting the first PMOS transistor and the second PMOS transistor, and an output terminal coupled to a control terminal of the sixth PMOS transistor;

a first resistor coupled to the output node and configured to receive the third current; and a temperature coefficient adjustment unit comprising a first bipolar junction transistor (BJT) configured to receive the first current and a second BJT configured to receive the second current;

wherein a control terminal of the second PMOS transistor and a control terminal of the fourth PMOS transistor are configured to receive a first bias voltage; and wherein the first bias voltage is set according to the level of the a power supply voltage received by the power supply voltage terminal, such that the second PMOS transistor operates in a linear mode when the power supply voltage is lower than a threshold, and operates in a saturation mode when the power supply voltage is higher than the threshold.

5. The bandgap reference circuit of claim 2, wherein the first amplifier comprising:

a first NMOS transistor having a first terminal, a second terminal, and a control terminal coupled to the first input terminal of the first amplifier;

a second NMOS transistor having a first terminal, a second terminal, and a control terminal coupled to the second input terminal of the first amplifier;

a third NMOS transistor having a first terminal coupled to the second terminal of the first NMOS transistor and the second terminal of the second NMOS transistor, a second terminal coupled to a ground terminal, and a control terminal configured to receive a second bias voltage;

a seventh PMOS transistor having a first terminal coupled to the power supply voltage terminal, a second terminal coupled to the first terminal of the first NMOS transistor, and a control terminal;

an eighth PMOS transistor having a first terminal coupled to the second terminal of the seventh PMOS transistor, a second terminal coupled to the output terminal of the first amplifier, and a control terminal for receiving the first bias voltage;

a ninth PMOS transistor having a first terminal coupled to the power supply voltage terminal, a second terminal coupled to the first terminal of the second NMOS transistor, and a control terminal coupled to the control terminal of the seventh PMOS transistor;

a tenth PMOS transistor having a first terminal coupled to the second terminal of the ninth PMOS transistor, a second terminal coupled to the control terminal of the ninth PMOS transistor, and a control terminal coupled to the control terminal of the eighth PMOS transistor;

a first load unit coupled to the second terminal of the eighth PMOS transistor; and a second load unit coupled to the second terminal of the tenth PMOS transistor.

6. The bandgap reference circuit of claim 5, wherein a control terminal of the second PMOS transistor and a control terminal of the fourth PMOS transistor are coupled to the control terminal of the eighth PMOS transistor.

7. The bandgap reference circuit of claim 5, wherein the first PMOS transistor, the third PMOS transistor, the fifth PMOS transistor, the seventh PMOS transistor and the ninth PMOS transistor have same size factors, and the second PMOS transistor, the fourth PMOS transistor, the sixth PMOS transistor, the eighth PMOS transistor, and the tenth PMOS transistor have same size factors.

8. The bandgap reference circuit of claim 1, wherein a first terminal of the first PMOS transistor is coupled to the power supply voltage terminal, a second terminal of the first PMOS transistor is coupled to the fourth node, a first terminal of the second PMOS transistor is coupled to the fourth node, and a second terminal of the second PMOS transistor is coupled to the first node.

9. The bandgap reference circuit of claim 1, wherein a first terminal of the fifth PMOS transistor is coupled to the power supply voltage terminal, a second terminal of the fifth PMOS transistor is coupled to the third node, a first terminal of the sixth PMOS transistor is coupled to the third node, and a second terminal of the sixth PMOS transistor is coupled to the output node.

10. The bandgap reference circuit of claim 1, wherein the first input terminal of the second amplifier is a negative input terminal, and the second input terminal of the second amplifier is a positive input terminal.

11. The bandgap reference circuit of claim 1, further comprising a first capacitor having a first terminal coupled to the power supply voltage terminal, and a second terminal coupled to the output terminal of the first amplifier.

12. The bandgap reference circuit of claim 1, wherein the first resistor has a first terminal coupled to the output node, and a second terminal coupled to a ground terminal.

13. The bandgap reference circuit of claim 1, further comprising a second capacitor having a first terminal coupled to the output node, and a second terminal coupled to a ground terminal.

14. The bandgap reference circuit of claim 1, wherein the first BJT has an emitter configured to receive at least part of the first current, a collector coupled to a ground terminal, and a base coupled to the ground terminal.

15. The bandgap reference circuit of claim 14, wherein the temperature coefficient adjustment unit further comprises a second resistor having a first terminal coupled to the first node, and a second terminal coupled to the ground terminal.

16. The bandgap reference circuit of claim 1, wherein the second BJT has an emitter configured to receive at least part of the second current, a collector coupled to a ground terminal, and a base coupled to the ground terminal.

17. The bandgap reference circuit of claim 16, wherein the temperature coefficient adjustment unit further comprises a third resistor having a first terminal coupled to the second node, and a second terminal coupled to the emitter of the second BJT.

18. The bandgap reference circuit of claim 16, wherein the temperature coefficient adjustment unit further comprises a fourth resistor having a first terminal coupled to the second node, and a second terminal coupled to the ground terminal.

19. A bandgap reference circuit configured to generate and output a reference voltage through an output node and comprising:

a first current source configured to generate a first current through a first node, the first current source comprising a first P-channel metal-oxide-semiconductor (PMOS) transistor and a second PMOS transistor connected in a cascode form between a power supply voltage terminal and the first node;

a second current source configured to generate a second current through a second node, the second current source comprising a third PMOS transistor and a fourth PMOS transistor connected in the cascode form between the power supply voltage terminal and the second node;

a third current source configured to generate a third current through the output node, the third current source comprising a fifth PMOS transistor and a sixth PMOS transistor connected in the cascode form between the power supply voltage terminal and the output node;

a first amplifier having a first input terminal coupled to the first node, a second input terminal coupled to the second node, and an output terminal coupled to a control terminal of the first PMOS transistor and a control terminal of the third PMOS transistor;

a second amplifier having a first input terminal coupled to a third node connecting the fifth PMOS transistor and the sixth PMOS transistor, a second input terminal coupled to a fourth node connecting the first PMOS transistor and the second PMOS transistor, and an output terminal coupled to a control terminal of the sixth PMOS transistor;

a first resistor coupled to the output node and configured to receive the third current; and a temperature coefficient adjustment unit comprising a first bipolar junction transistor (BJT) configured to receive the first current and a second BJT configured to receive the second current;

wherein a width to length ratio of the second PMOS transistor is greater than a width to length ratio of the first PMOS transistor.

* * * * *